United States Patent [19]
Koya

[11] Patent Number: 6,078,061
[45] Date of Patent: Jun. 20, 2000

[54] LIGHT EMITTING DIODE WITH PATTERNED ELECTRODE

[75] Inventor: Keiichi Koya, Tokyo, Japan

[73] Assignee: Oki Data Corporation, Takasaki, Japan

[21] Appl. No.: 09/055,986

[22] Filed: Apr. 7, 1998

[30] Foreign Application Priority Data

Jun. 30, 1997 [JP] Japan ................................ 9-172702

[51] Int. Cl.$^7$ .................................................. H01L 33/00
[52] U.S. Cl. ................................ 257/91; 257/94; 257/96; 257/97; 257/99; 438/46; 438/47
[58] Field of Search .............................. 257/99, 94, 96, 257/97, 91; 438/46, 47

[56] References Cited

U.S. PATENT DOCUMENTS

| | | | |
|---|---|---|---|
| 4,145,707 | 3/1979 | Sadamassa et al. | 357/68 |
| 4,924,276 | 5/1990 | Heime et al. | 357/17 |
| 5,113,232 | 5/1992 | Itoh et al. | 357/17 |
| 5,449,926 | 9/1995 | Holm et al. | 257/88 |
| 5,652,438 | 7/1997 | Sassa et al. | 257/94 |

*Primary Examiner*—William Mintel
*Attorney, Agent, or Firm*—Jones Volentine, L.L.P.

[57] ABSTRACT

The opening portion as the pattern shift detecting portion is formed in the insulating layer so that an edge of the electrode pattern extends to the opening portion when the electrode pattern shifts and the contact resistivity between the light emitting portion and the electrode pattern increases more than the predetermined value during the patterning process. If the electrode pattern shifts to a direction of the scribe line, the electrode pattern is electrically connected to the P-type diffusion region via the pattern shift detecting portion. As a result, the electrode pattern is shorted an N-type electrode pattern via the P-type diffusion region and the N-type GaAsP/GaAs substrate Therefore, the light emitting diode can precisely detect inferior products without visual inspection.

16 Claims, 8 Drawing Sheets

LIGHT EMITTING DIODE WITH PATTERNED ELECTRODE

BACKGROUND OF THE INVENTION

1. Field of the Invention

The present invention generally relates to a light emitting diode and to a method for forming the light emitting diode, and more particularly, the present invention relates to a light emitting diode which has a pattern shift detecting portion used to detect a pattern shift of an electrode pattern after a patterning process of the electrode pattern, and to a method for forming the light emitting diode.

This application is a counterpart of Japanese application Serial Number 172702/1997, filed Jun. 30, 1997, the subject matter of which is incorporated herein by reference.

2. Description of the Related Art

In general, a conventional light emitting diode is made up of an N-type GaAsP/GaAs substrate, an insulating layer formed on the N-type GaAsP/GaAs substrate, an opening portion which exposes a part of the N-type GaAsP/GaAs substrate surface and which is formed in the insulating layer, a P-type light emitting portion formed in the N-type GaAsP/GaAs substrate surface via the opening portion, and a P-type electrode pattern which is electrically connected to the light emitting portion and which has a pad portion.

However, an electrode patterning process may cause a pattern shift of the electrode pattern, and as a result, the electrode pattern may not be electrically connected to the light emitting portion.

SUMMARY OF THE INVENTION

An object of the present invention is to provide a light emitting diode and a method for forming the same that can precisely detect inferior products without the visual inspection.

According to one aspect of the present invention, for achieving the above object, there is provided a light emitting diode comprising: a substrate of a first conductivity type; an insulating layer formed on a surface of said substrate, said insulator including a first opening therein so as to expose a first surface portion of said substrate, and a second opening therein so as to expose a second surface portion of said substrate, said first and second openings being spaced apart by a predetermined distance; a light emitting region of a second conductivity type formed in the first surface portion of said substrate; a patterned electrode formed on said insulation layer between said first and second openings and having opposite first and second ends, wherein the first end of said patterned electrode extends into said first opening so as to contact said light emitting region, and wherein a length from said first end to said second end of said patterned electrode is such that said second end contacts said second surface portion of said substrate when said first end extends into said first opening by less then a preset amount.

According to another aspect of the present invention, for achieving the above object, there is provided a method for forming a light emitting diode, comprising: providing a substrate of a first conductivity type; forming an insulating layer formed on a surface of said substrate; forming a first opening in said insulating layer so as to expose a first surface portion of said substrate, and a second opening in said insulating layer so as to expose a second surface portion of said substrate, said first and second openings being formed so as to be spaced apart by a predetermined distance; forming a light emitting region of a second conductivity type in the first surface portion of said substrate; forming a patterned electrode on said insulating layer between said first and second openings and having opposite first and second ends, wherein the first end of said patterned electrode is formed to extend into said first opening so as to contact said light emitting region, and wherein a length from said first end to said second end of said patterned electrode is such that said second end contacts said second surface portion of said substrate when said first end extends into said first opening by less then a preset distance and said second end does not contact the second surface portion of said substrate when said first end extends into the first opening by equal to or more than a preset distance.

According to another aspect of the present invention, for achieving the above object, there is provided a light emitting diode comprising: a substrate of a first conductivity type; an insulating layer formed on a surface of said substrate, said insulator including a opening therein so as to expose a first surface portion of said substrate, and a terminating edge so as to expose a second surface portion of said substrate, said opening and said terminating edge being spaced apart by a predetermined distance; a light emitting region of a second conductivity type formed in the first surface portion of said substrate; a patterned electrode formed on said insulating layer between said openings and said terminating edge having opposite first and second protruding ends, wherein the first protruding end of said patterned electrode extends into said first opening so as to contact said light emitting region, and wherein a length from said first protruding end to said second protruding end of said patterned electrode is such that said second protruding end contacts said second surface portion of said substrate when said first protruding end extends into said first opening by less then a preset distance and said second protruding end does not contact the second surface portion of said substrate when said first protruding end extends into the first opening by equal to or more than a preset distance.

According to another aspect of the present invention, for achieving the above object, there is provided a method for forming a light emitting diode, comprising: providing a substrate of a first conductivity type; forming an insulating layer formed on a surface of said substrate, said insulating layer having a terminating edge exposing a second surface portion of said substrate; forming an opening in said insulating layer so as to expose a first surface portion of said substrate, said opening and said terminating edge being formed so as to be spaced apart by a predetermined distance; forming a light emitting region of a second conductivity type in the first surface portion of said substrate; forming a patterned electrode on said insulating layer between said opening and said terminating edge and having opposite first and second protruding ends, wherein the first protruding end of said patterned electrode is formed to extend into said opening so as to contact said light emitting region, and wherein a length from said first protruding end to said second protruding end of said patterned electrode is such that said second protruding end contacts said second surface portion of said substrate when said first protruding end extends into said opening by less then a preset amount.

BRIEF DESCRIPTION OF THE DRAWINGS

While the specification concludes claims particularly pointing out and distinctly claiming the subject matter that is regarded as the invention, the invention, along with the objects, features, and advantages thereof, will be better understood from the following description taken in connection with the accompanying drawings, in which:

DETAILED DESCRIPTION OF THE PREFERRED EMBODIMENTS

A light emitting diode according to a first preferred embodiment of the present invention will hereinafter be described in detail with FIG. 1, FIG. 2, FIG. 3, FIG. 4A, and FIG. 4B.

Figure 1:
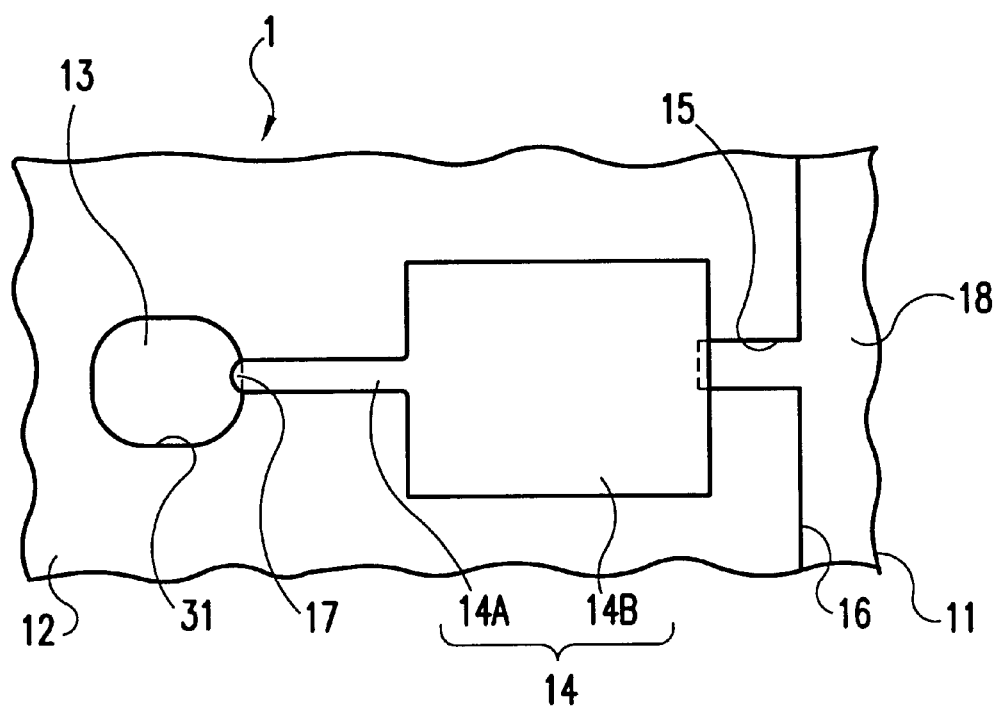
FIG. 1 is a plane view showing a light emitting diode according to a first preferred embodiment of a present invention.
Figure 2:
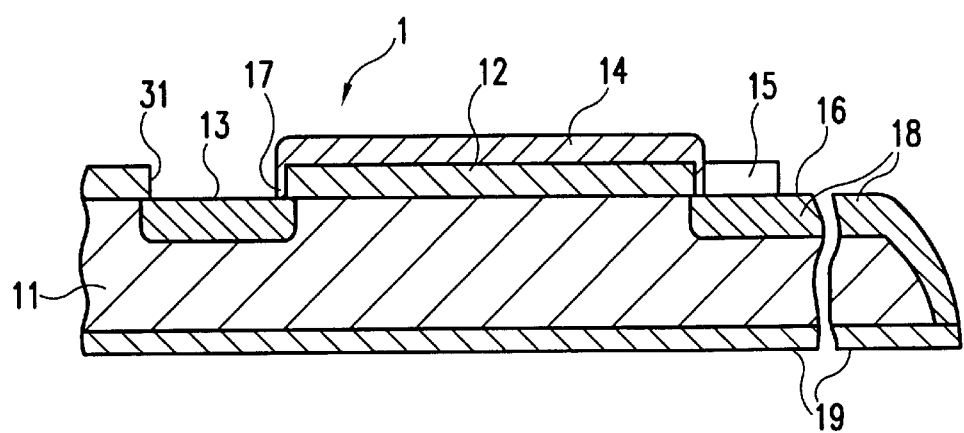
FIG. 2 is a sectional view showing a light emitting diode according to a first preferred embodiment of a present invention.

FIG. 1 is a plane view showing a light emitting diode according to a first preferred embodiment of the present invention. FIG. 2 is a sectional view showing the light emitting diode according to the first preferred embodiment of the present invention.

As shown in FIG. 1 and FIG. 2, the light emitting diode 1 is preferably made up of an N-type GaAsP/GaAs substrate 11, an insulating layer 12 formed on the N-type GaAsP/GaAs substrate, an opening portion 31 which exposes a predetermined part of the N-type GaAsP/GaAs substrate 11 surface and which is formed in the insulating layer 12, a P-type light emitting portion 13 formed in the N-type GaAsP/GaAs substrate 11 surface via the opening portion, an opening portion 15 which serves as a pattern shift detecting portion 15 and which is exposed a predetermined part of the N-type GaAsP/GaAs substrate 11 surface, and a P-type electrode pattern 14 electrically connected to the light emitting portion 13. The insulating layer 12 is preferably made up of an oxide layer, a nitride layer, or a combination layer of the oxide layer and the nitride layer. The light emitting portion 13 is preferably made up of a diffusion layer formed by diffusing zinc of a P-type impurity. The electrode pattern 14 is preferably made up of a connection portion 14A and a pad portion 14B and which is preferably made up of aluminum or gold. Imperfections in the patterning process can shift the electrode pattern 14, and as a result a value of a contact resistivity between the light emitting portion 13 and the electrode pattern 14 can be increased to more than a predetermined acceptable value. In this circumstance, the edge of the electrode pattern 14 extends to the pattern shift detecting portion 15. That is, the opening portion 15, which functions as a pattern shift detecting portion therein is formed in the insulating layer 12 such that an edge of the electrode pattern 14 extends therein when the electrode pattern 14 shifted during the patterning process. Further, the opening portion 15 is formed adjoining a scribe line 16. The scribe line region exposes a predetermined portion of the N-type GaAsP/GaAs substrate 11 surface. A P-type diffusion region 18 is formed in the exposed surface in the opening portion 15 simultaneously with the formation of the light emitting portion 13. As shown in FIG. 2, if the electrode pattern 14 shifts to a direction of the scribe line 16, the electrode pattern 14 is electrically connected to the P-type diffusion region 18 via the opening portion 15. As a result, the electrode pattern 14 is shorted to an N-type electrode pattern 19 via the P-type diffusion region 18 and the N-type GaAsP/GaAs substrate 11. Further, in the case wherein the P-type diffusion region 18 is not formed on the exposed surface, if the electrode pattern 14 shifts in a direction of the scribe line 16, the electrode pattern 14 becomes electrically connected to the N-type GaAsP/GaAs substrate 11 via the pattern shift detecting portion 15. As a result, the electrode pattern 14 is shorted to the N-type electrode pattern 19 via the N-type GaAsP/GaAs substrate 11.

Figure 3:
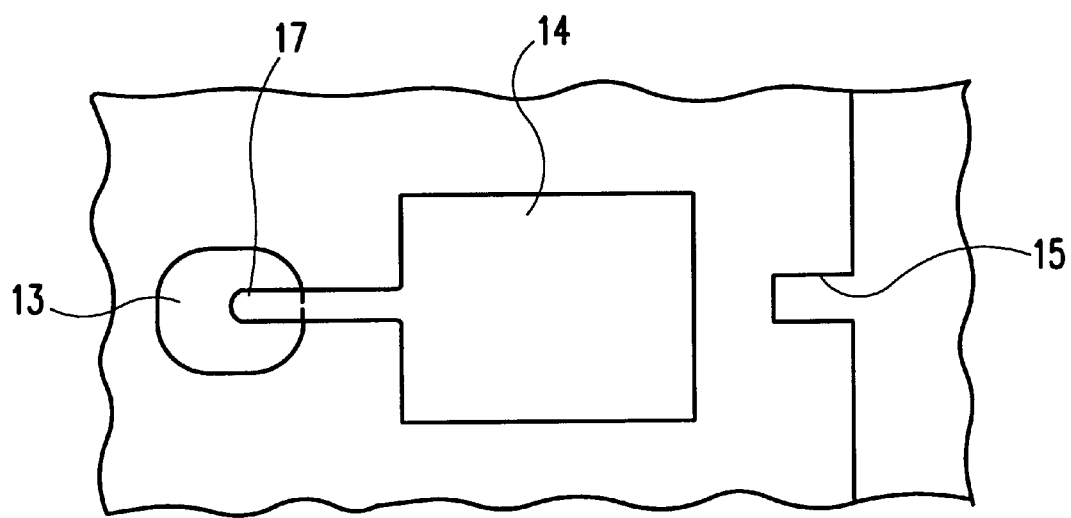
FIG. 3 is a plane view showing a light emitting diode formed without a pattern shift of an electrode pattern according to a first preferred embodiment of a present invention.

As shown in FIG. 3, if the electrode pattern 14 does not shift in a direction of the scribe line 16, the electrode pattern 14 does not extend to the pattern shift detecting portion 15, and therefore the electrode pattern 14 is not shorted to the N-type electrode pattern 19.

Figure 4A:
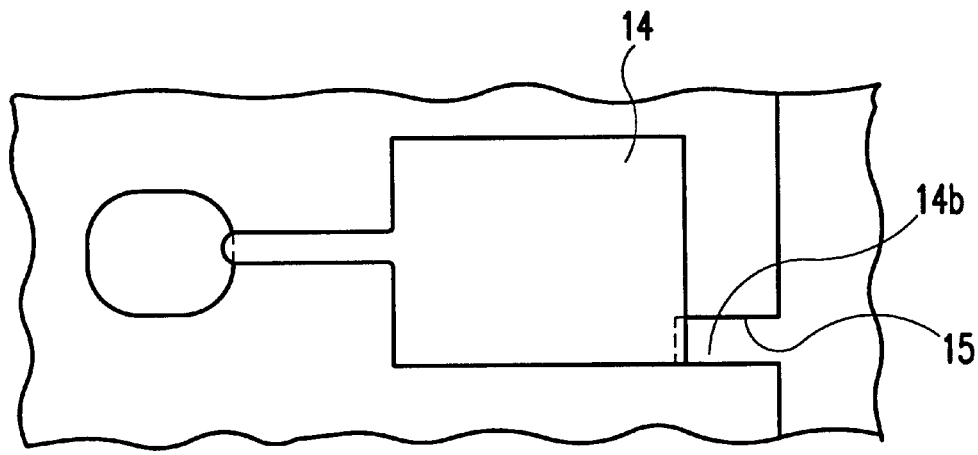
FIG. 4A and B are plane views showing modified example of the light emitting diode according to the first preferred embodiment of the present invention.

FIG. 4A and B are plane views showing modified examples of the light emitting diode according to the first preferred embodiment of the present invention.

As shown in FIG. 4A, the opening portion 15, which functions as the pattern shift detecting portion, is formed in the insulating layer 12 so that a side edge 14b of the electrode pattern 14 extends to the opening portion 15 when the electrode pattern 14 is shifted and the contact resistivity between the light emitting portion 13 and the electrode pattern 14 is increased to more than the predetermined acceptable value.

Figure 4B:
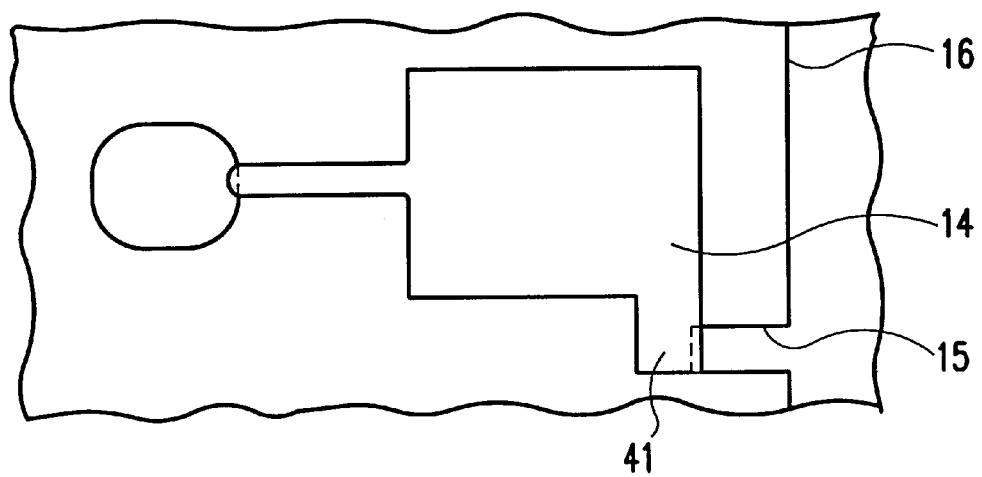

As shown in FIG. 4B, the opening portion 15 as the pattern shift detecting portion is formed in the insulating layer 12 so that a projection portion 41 of the electrode pattern 14 extends to the opening portion 15 when the electrode pattern 14 is shifted and the contact resistivity between the light emitting portion 13 and the electrode pattern 14 is increased to more than the predetermined acceptable value.

As mentioned above, in the first preferred embodiment of the present invention, the opening portion 15, which functions as the pattern shift detecting portion, is formed in the insulating layer 12 so that an edge 14b of the electrode pattern 14 extends to the opening portion 15 when the electrode pattern 14 is shifted and the contact resistivity between the light emitting portion 13 and the electrode pattern 14 is increased to more than the predetermined acceptable value. If the electrode pattern 14 shifts in a direction of the scribe line 16, the electrode pattern 14 is electrically connected to the P-type diffusion region 18 via the pattern shift detecting portion 15. As a result, the electrode pattern 14 is shorted to the N-type electrode pattern 19 via the P-type diffusion region 18 and the N-type GaAsP/GaAs substrate 11. Therefore, the first preferred embodiment of the present invention can precisely detect inferior products by measuring a forward voltage or a backward current using a probing technique without the visual inspection.

A method for forming a light emitting diode according to a first preferred embodiment of the present invention will hereinafter be described in detail with reference to FIG. 1 and FIG. 2.

The insulating layer 12 is formed on the N-type GaAsP/GaAs substrate 11 and is preferably made up of an oxide layer, a nitride layer, or a combination layer of the oxide layer and the nitride layer. The opening portion 31 is formed in the insulating layer 12 so as to expose a predetermined part of the N-type GaAsP/GaAs substrate 11 surface using a photo-lithographic process and an etching process. The opening portion 15, which function as the pattern shift detecting portion, is simultaneously formed with the opening portion 31. The opening portion 15 is formed in the insulating layer 12 so that an edge 14b of the electrode pattern 14 extends to the opening portion 15 when the electrode pattern 14 is shifted and the contact resistivity between the light emitting portion 13 and the electrode pattern 14 is increased to more than the predetermined acceptable value. The P-type light emitting portion 13 is formed in the N-type GaAsP/GaAs substrate 11 surface via the opening portion 31 and is preferably made up of a diffusion layer formed by diffusing zinc of a P-type impurity. The P-type diffusion region 18 is formed in the exposed surface in the opening portion 15, which is simultaneously formed with the exposed surface in the opening portion 31 of the light emitting portion 13. The P-type electrode pattern 14 is electrically connected to the light emitting portion 13 using a photo-lithographic process and the etching process. The electrode pattern 14 is preferably made up of a connection portion 14A and a pad portion 14B and which is preferably made up of aluminum or gold. The light emitting diode 1 can precisely detect inferior products by measuring a forward voltage or a backward current using a probing technique without visual inspection.

As mentioned above, in a method for forming a light emitting diode of the first preferred embodiment, the opening portion 15 can simultaneously formed with the opening portion 31 of the light emitting portion 13. Accordingly, the light emitting diode of the first preferred embodiment can be formed without adding additional formation process steps for the opening portion 15.

Further, in the method for forming a light emitting diode of the first preferred embodiment, the diffusion region 18 is formed in the exposed surface in the opening portion 15, and can be simultaneously formed with the exposed surface in the opening portion 31 of the light emitting portion 13. Accordingly, the light emitting diode of the first preferred embodiment can be formed without adding additional formation process steps for the diffusion region 18 formed in the exposed surface of the opening portion 15.

Figure 5:
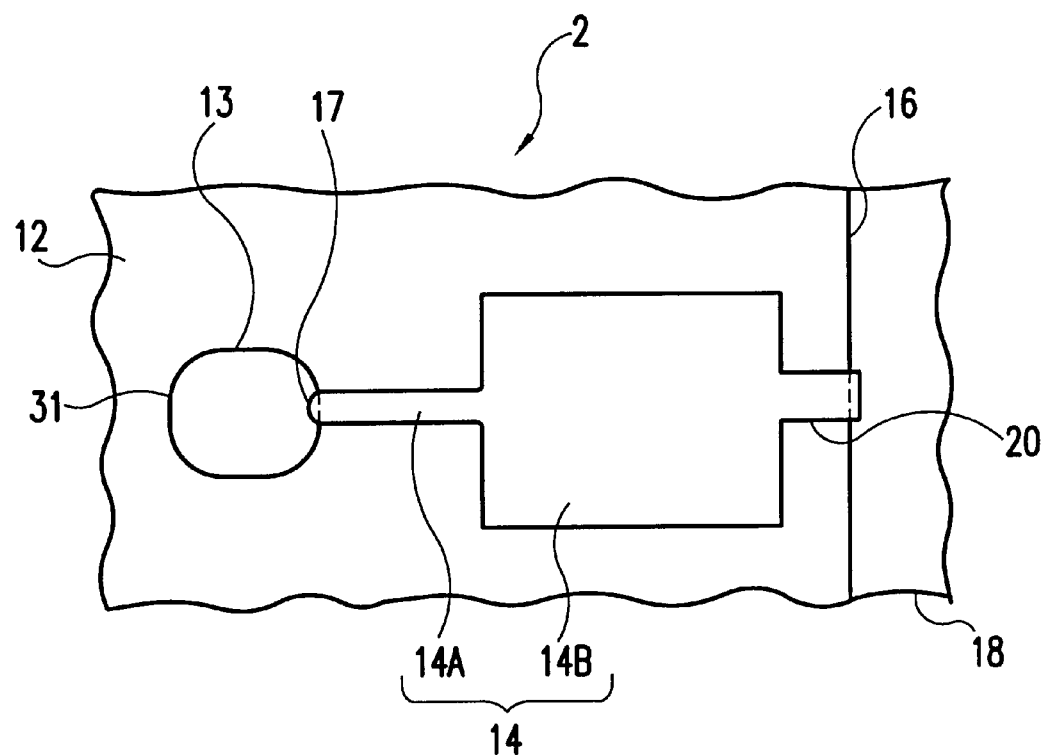
FIG. 5 is a plane view showing the light emitting diode according to a second preferred embodiment of the present invention.
Figure 6:
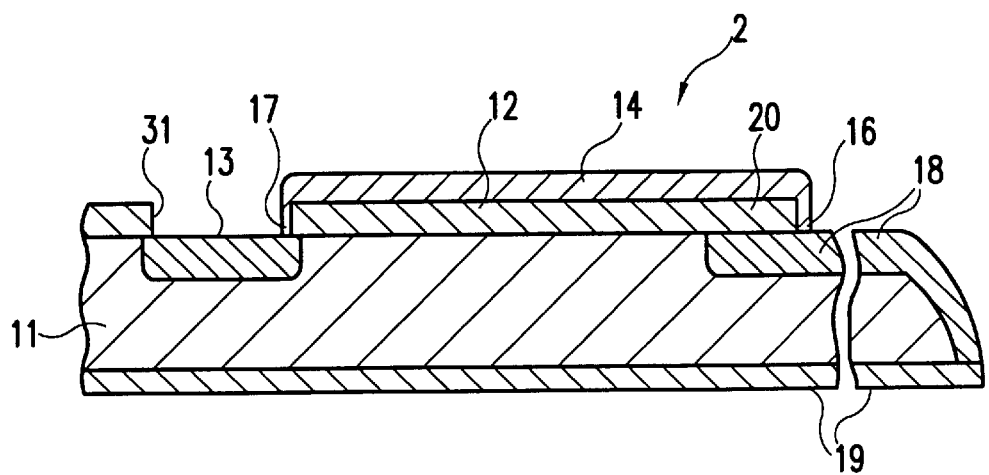
FIG. 6 is a sectional view showing the light emitting diode according to the second preferred embodiment of the present invention.

FIG. 5 is a plane view showing the light emitting diode according to a second preferred embodiment of the present invention. FIG. 6 is a sectional view showing the light emitting diode according to the second preferred embodiment of the present invention.

As shown in FIG. 5 and FIG. 6, the light emitting diode 2 is preferably made up of an N-type GaAsP/GaAs substrate 11, an insulating layer 12 formed on the N-type GaAsP/GaAs substrate, an opening portion 31 which exposes a surface of the N-type GaAsP/GaAs substrate 11 and which is formed in the insulating layer 12, a P-type light emitting portion 13 formed in the N-type GaAsP/GaAs substrate 11 via the opening portion 31, and a P-type electrode pattern 14 electrically connected to the light emitting portion 13. The insulating layer 12 is preferably made up of an oxide layer, a nitride layer, or a combination layer of the oxide layer and the nitride layer. The light emitting portion 13 is preferably made up of a diffusion layer formed by diffusing zinc as a P-type impurity. The electrode pattern 14 is preferably made up of a connection portion 14A, a pad portion 14B, and a projection portion 20, which function as a pattern shift detecting portion, and which is preferably made up of aluminum or gold.

Imperfections in the patterning process can shifted the electrode pattern 14, and as a result a value of a contact resistivity between the light emitting portion 13 and the electrode pattern 14 can be increased to more than a predetermined acceptable value. In this circumstance, the projection portion 20 of the electrode pattern 14 extends to a exposed surface of the N-type GaAsP/GaAs substrate 11 across a scribe line 16. A P-type diffusion region 18 is formed on the exposed surface of the N-type GaAsP/GaAs substrate 11. As shown in FIG. 6, if the electrode pattern 14 shifts in a direction of the scribe line 16, the electrode pattern 14 is electrically connected to the P-type diffusion region 18 across the scribe line 16 via the projection portion 20. As a result, the electrode pattern 14 is shorted to the N-type electrode pattern 19 via the P-type diffusion region 18 and the N-type GaAsP/GaAs substrate 11. Further, in the case where the P-type diffusion region 18 is not formed on the exposed surface of the N-type GaAsP/GaAs substrate 11, if the electrode pattern 14 is shifted in a direction of the scribe line 16, the electrode pattern 14 is electrically connected to the N-type GaAsP/GaAs substrate 11 across the scribe line 16 via the projection portion 20. As a result, the electrode pattern 14 is shorted to the N-type electrode pattern 19 via the N-type GaAsP/GaAs substrate 11.

Figure 7:
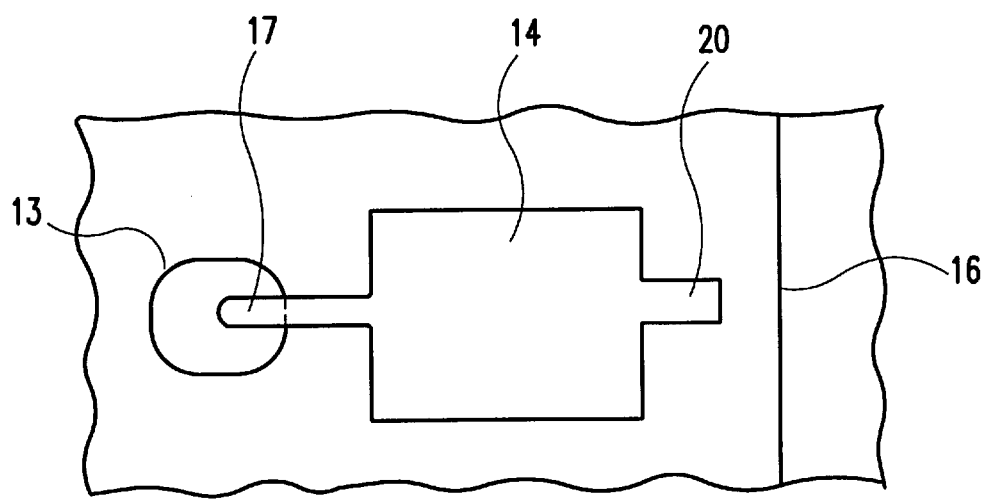
FIG. 7 is a plane view showing a light emitting diode formed without a pattern shift of an electrode pattern according to a second preferred embodiment of a present invention.

As shown in FIG. 7, if the electrode pattern 14 does not shift in a direction of the scribe line 16, the projection portion 20 of the electrode pattern 14 does not extend to the exposed surface of the N-type GaAsP/GaAs substrate 11 across a scribe line 16, and therefore the electrode pattern 14 is not shorted to the N-type electrode pattern 19.

Figure 8A:
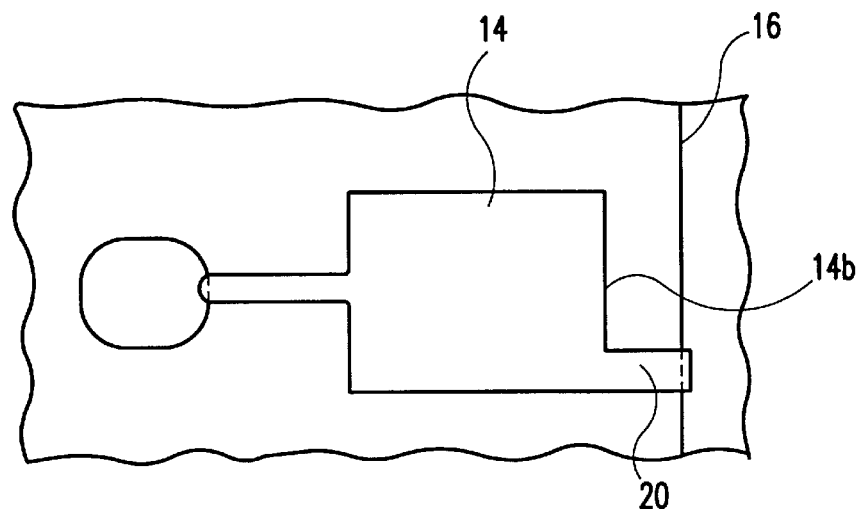
FIG. 8A and B are plane views showing a modified example of the light emitting diode according to the second preferred embodiment of the present invention.

FIG. 8A and B are plane views showing modified examples of the light emitting diode according to the second preferred embodiment of the present invention.

As shown in FIG. 8A, the electrode pattern 14 is formed so that the projection portion 20 formed in a side edge 14b of the electrode pattern 14 extends to the exposed surface of the N-type GaAsP/GaAs substrate 11 across the scribe line 16 when the electrode pattern 14 is shifted and the contact resistivity between the light emitting portion 13 and the electrode pattern 14 is increased to more than the predetermined acceptable value.

Figure 8B:
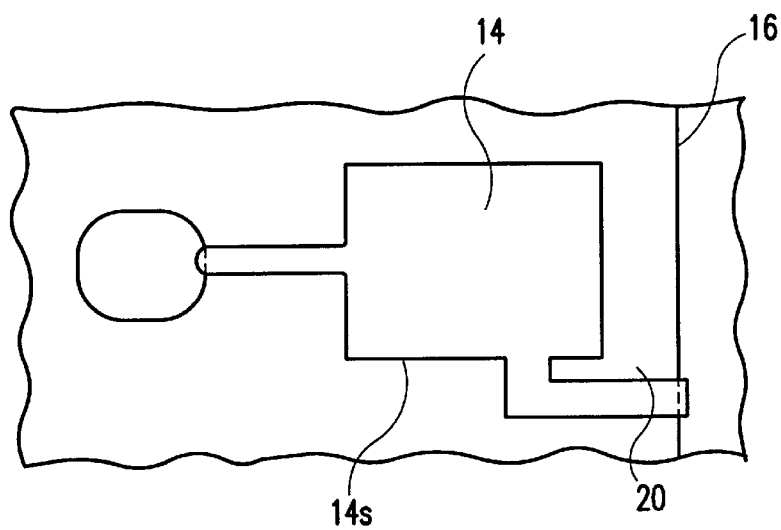

As shown in FIG. 8B, the electrode pattern 14 is formed so that the projection portion 20 formed in a side edge 14s of the electrode pattern 14 extends to the exposed surface of the N-type GaAsP/GaAs substrate 11 across the scribe line 16 when the electrode pattern 14 is shifted and the contact resistivity between the light emitting portion 13 and the electrode pattern 14 is increased to more than the predetermined acceptable value.

As mentioned above, in the second preferred embodiment of the present invention, the electrode pattern 14 is formed so that the projection portion 20 of the electrode pattern 14 extends to the exposed surface of the N-type GaAsP/GaAs substrate 11 across the scribe line 16 when the electrode pattern 14 is shifted and the contact resistivity between the light emitting portion 13 and the electrode pattern 14 is increased to more than the predetermined acceptable value. If the electrode pattern 14 is shifted in a direction of the scribe line 16, the electrode pattern 14 is electrically connected to the P-type diffusion region 18 across the scribe line 16 via the projection portion 20. As a result, the electrode pattern 14 is shorted to the N-type electrode pattern 19 via the P-type diffusion region 18 and the N-type GaAsP/GaAs substrate 11. Therefore, the second preferred embodiment of the present invention can precisely detect inferior products by measuring a forward voltage or a backward current using a probing technique without visual inspection.

A method for forming a light emitting diode according to a second preferred embodiment of the present invention will hereinafter be described in detail with reference to FIG. 5 and FIG. 6.

The insulating layer 12 is formed on the N-type GaAsP/GaAs substrate 11 and is preferably made up of an oxide layer, a nitride layer, or a combination layer of the oxide layer and the nitride layer. The opening portion 31 is formed in the insulating layer 12 so as to expose a predetermined part of the N-type GaAsP/GaAs substrate 11 surface using a photo-lithographic process and an etching process. The P-type light emitting portion 13 is formed in the N-type GaAsP/GaAs substrate 11 surface via the opening portion 31 and is preferably made up of a diffusion layer formed by diffusing zinc of a P-type impurity. The P-type diffusion region 18 is simultaneously formed with the exposed surface in the opening portion 31 of the light emitting portion 13. The P-type electrode pattern 14 is electrically connected to the light emitting portion 13 using a photo-lithographic process and an etching process. The electrode pattern 14 is formed so that the projection portion 20 of the electrode pattern 14 extends to the exposed surface of the N-type GaAsP/GaAs substrate 11 across a scribe line 16 when the electrode pattern 14 is shifted and the contact resistivity between the light emitting portion 13 and the electrode pattern 14 is increased to more than the predetermined acceptable value. The electrode pattern 14 is preferably made up of a connection portion 14A and a pad portion 14B and is preferably made up of aluminum or gold. The light emitting diode 2 can precisely detect inferior products by measuring a forward voltage or a backward current using a probing technique without visual inspection.

As mentioned above, in a method for forming a light emitting diode of the second preferred embodiment, the projection portion 20, which functions as a pattern shift detecting portion, can be simultaneously formed with the electrode pattern 14. Accordingly, the light emitting diode of the second preferred embodiment can be formed without adding additional steps for the formation of the projection portion 20.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A light emitting diode comprising:
   a substrate of a first conductivity type;
   an insulating layer formed on a surface portion of said substrate, said insulating layer including a first opening therein so as to expose a first surface portion of said substrate and a second opening therein so as to expose a second surface portion of said substrate, said first and second openings being spaced apart by a predetermined distance;
   a light emitting region of a second conductivity type formed in the first surface portion of said substrate; and
   a patterned electrode formed on said insulating layer between said first and second openings and having opposite first and second ends, wherein the first end of said patterned electrode extends toward said first opening and said second end of said patterned electrode extends toward said second opening, and wherein a length from said first end to said second end of said patterned electrode is such that said second end contacts said second surface portion of said substrate when said first end extends into said first opening by less than a preset distance and said second end does not contact said second surface portion of said substrate when said first end extends into said first opening by equal to or more than the preset distance.

2. A light emitting diode as claimed in claim 1, wherein said light emitting region is a diffusion region of the second conductivity type.

3. A light emitting diode as claimed in claim 1, further comprising a diffusion region of the second conductivity type in the second surface portion of said substrate.

4. A light emitting diode comprising:
   a substrate of a first conductivity type;
   an insulating layer formed on a surface portion of said substrate, said insulating layer including a first opening therein so as to expose a first surface portion of said substrate and a terminating edge so as to expose a second opening of a second surface portion of said substrate, said openings and said terminating edge being spaced apart by a predetermined distance;
   a light emitting region of a second conductivity type formed in the first surface portion of said substrate; and
   a patterned electrode formed on said insulating layer between said first and second openings and having opposite first and second protruding ends, wherein the first protruding end of said patterned electrode extends toward said first opening and said second protruding end of said patterned electrode extends toward said second opening, and wherein a length from said first protruding end to said second protruding end of said patterned electrode is such that said second protruding end contacts said second surface portion of said substrate when said first protruding end extends into said first opening by less then a preset distance and said second protruding end does not contact said second surface portion of said substrate when said first protruding end extends into said first opening by equal to or more than the preset distance.

5. A light emitting diode as claimed in claim 4, wherein said light emitting region is a diffusion region of the second conductivity type.

6. A light emitting diode as claimed in claim 4, further comprising a diffusion region of the second conductivity type in the second surface portion of said substrate.

7. A light emitting diode as claimed in claim 1, further comprising a feedback mechanism in said second opening, said feedback mechanism being triggered when said second end extends into said second surface portion.

8. A light emitting diode as claimed in claim 7, wherein said feedback mechanism includes a connector and a bottom electrode, said second end contacting the connector to thereby electrically connect said patterned electrode and said bottom electrode when the second end extends into said second surface portion.

9. A light emitting diode as claimed in claim 8, wherein said connector includes a layer of the second conductivity type formed on said second surface portion.

10. A light emitting diode as claimed in claim 9, wherein said layer of the second conductivity type formed on said second surface portion extends from said second opening to a bottom surface of the substrate.

11. A light emitting diode as claimed in claim 1, wherein said second surface portion is a pattern shift detecting portion which indicates a shift in position of the patterned electrode beyond a predetermined position.

12. A light emitting diode as claimed in claim 4, further comprising a feedback mechanism in said second opening, said feedback mechanism being triggered when said second protruding end extends into said second surface portion.

13. A light emitting diode as claimed in claim 12, wherein said feedback mechanism includes a connector and a bottom electrode, said second end contacting the connector to thereby electrically connect said patterned electrode and said bottom electrode when the second end extends into said second surface portion.

14. A light emitting diode as claimed in claim 13, wherein said connector includes a layer of the second conductivity type formed on said second surface portion.

15. A light emitting diode as claimed in claim 14, wherein said layer of the second conductivity type formed on said second surface portion extends from said second opening to a bottom surface of the substrate.

16. A light emitting diode as claimed in claim 4, wherein said second surface portion is a pattern shift detecting portion which indicates a shift in position of the patterned electrode beyond a predetermined position.

\* \* \* \* \*